US011335830B2

(12) United States Patent
Hirao

(10) Patent No.: US 11,335,830 B2
(45) Date of Patent: May 17, 2022

(54) PHOTO-EMISSION SEMICONDUCTOR DEVICE AND METHOD OF MANUFACTURING SAME

(71) Applicant: Sony Corporation, Tokyo (JP)

(72) Inventor: Naoki Hirao, Kanagawa (JP)

(73) Assignee: Sony Corporation, Tokyo (JP)

( * ) Notice: Subject to any disclaimer, the term of this patent is extended or adjusted under 35 U.S.C. 154(b) by 22 days.

(21) Appl. No.: 15/679,459

(22) Filed: Aug. 17, 2017

(65) Prior Publication Data
US 2017/0345973 A1 Nov. 30, 2017

Related U.S. Application Data

(62) Division of application No. 13/053,433, filed on Mar. 22, 2011, now abandoned.

(30) Foreign Application Priority Data

Mar. 30, 2010 (JP) ............................. JP2010-078239

(51) Int. Cl.
H01L 33/40 (2010.01)
H01L 23/00 (2006.01)
(Continued)

(52) U.S. Cl.
CPC ............ *H01L 33/405* (2013.01); *H01L 24/03* (2013.01); *H01L 24/05* (2013.01);
(Continued)

(58) Field of Classification Search
CPC ....... H01L 33/36; H01L 33/40; H01L 33/405; H01L 33/46; H01L 2933/0016; H01L 2224/0508–05098; H01L 2224/0558–05584; H01L 2224/05007; H01L 2224/05547; H01L 2224/05561; H01L 21/568; H01L 21/6835; H01L 21/6836; H01L 23/3107; H01L 23/3135; H01L 23/49562; H01L 23/49575; H01L 23/49541; H01L 23/49844; H01L 23/49827; H01L 23/5384; H01L 23/5386;
(Continued)

(56) References Cited

U.S. PATENT DOCUMENTS 1,627,900 A * 5/1927 Hewitson ................. C25D 5/44
205/213
7,164,158 B2 1/2007 Stein et al.
(Continued)

FOREIGN PATENT DOCUMENTS

CN 100565949 C 12/2009
JP 2004-260178 A 9/2004
(Continued)

*Primary Examiner* — Yu Chen
(74) *Attorney, Agent, or Firm* — Wolf, Greenfield & Sacks, P.C.

(57) ABSTRACT

A photo-emission semiconductor device superior in reliability is provided. The photo-emission semiconductor device includes a semiconductor layer, a light reflection layer provided on the semiconductor layer, and a protective layer formed by electroless plating to cover the light reflection
(Continued)

layer. Therefore, even if the whole structure is reduced in size, the protective layer reliably covers the light reflection layer without gap.

5 Claims, 8 Drawing Sheets

(51) Int. Cl.
  *H01L 33/62* (2010.01)
  *H01L 33/00* (2010.01)
(52) U.S. Cl.
  CPC .......... *H01L 33/0093* (2020.05); *H01L 33/62* (2013.01); *H01L 2224/0391* (2013.01); *H01L 2224/03464* (2013.01); *H01L 2224/0401* (2013.01); *H01L 2224/05082* (2013.01); *H01L 2224/05139* (2013.01); *H01L 2224/05561* (2013.01); *H01L 2224/05582* (2013.01); *H01L 2224/05655* (2013.01); *H01L 2924/0002* (2013.01); *H01L 2933/0016* (2013.01)
(58) Field of Classification Search
  CPC ............. H01L 23/5389; H01L 23/481; H01L 2221/68359; H01L 2221/68372; H01L 2224/82005; H01L 33/0062–0075; H01L 2224/05186–05188; H01L 2224/05686–05688; H01L 2224/0219; H01L 2224/02215; H01L 2224/03019; H01L 2224/0312; H01L 2224/03464
  See application file for complete search history.

(56) References Cited

U.S. PATENT DOCUMENTS

| | | |
|---|---|---|
| 7,436,066 B2 | 10/2008 | Sonobe et al. |
| 9,373,274 B2 | 6/2016 | Okuyama |
| 9,786,638 B2 | 10/2017 | Okuyama |
| 2003/0052328 A1 | 3/2003 | Uemura |
| 2004/0256632 A1 | 12/2004 | Stein et al. |
| 2005/0277283 A1* | 12/2005 | Lin .................. H01L 23/53238 438/618 |
| 2007/0023777 A1* | 2/2007 | Sonobe .................. H01L 33/40 257/103 |
| 2007/0057272 A1 | 3/2007 | Urashima |
| 2007/0114552 A1 | 5/2007 | Jang et al. |
| 2008/0099780 A1* | 5/2008 | Tran .................... H01L 33/0079 257/103 |
| 2008/0305631 A1 | 12/2008 | Hirao |
| 2009/0014747 A1 | 1/2009 | Shiue et al. |
| 2010/0136727 A1 | 6/2010 | Osawa et al. |
| 2011/0031519 A1 | 2/2011 | Hirao et al. |
| 2011/0241047 A1 | 10/2011 | Hirao |
| 2012/0092389 A1 | 4/2012 | Okuyama |
| 2016/0276323 A1 | 9/2016 | Okuyama |
| 2017/0133554 A1 | 5/2017 | Okuyama |

FOREIGN PATENT DOCUMENTS

| | | |
|---|---|---|
| JP | 2007-080899 A | 3/2007 |
| JP | 2007-081312 A | 3/2007 |
| WO | WO 2007/032546 A1 | 3/2007 |

* cited by examiner

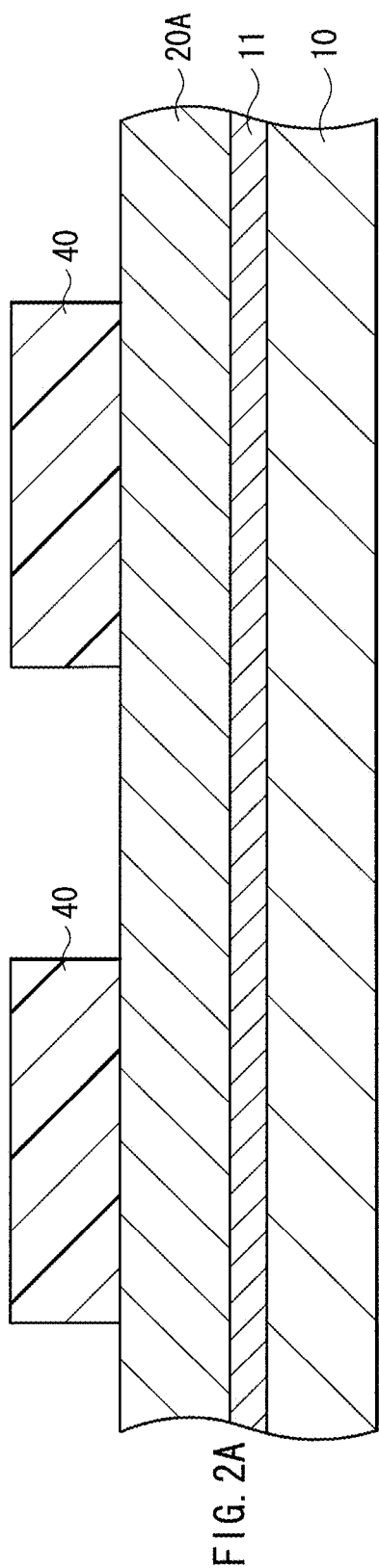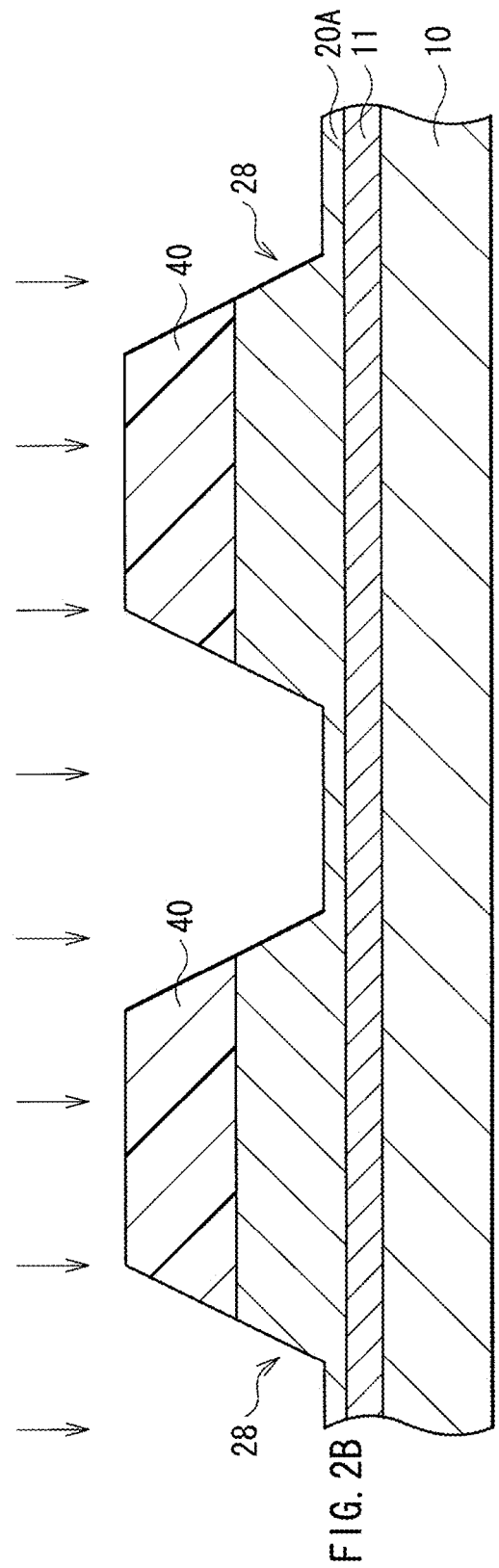

PHOTO-EMISSION SEMICONDUCTOR DEVICE AND METHOD OF MANUFACTURING SAME

CROSS REFERENCES TO RELATED APPLICATIONS

This application is a division of and claims the benefit under 35 U.S.C. §120 of U.S. patent application Ser. No. 13/053,433, titled "PHOTO-EMISSION SEMICONDUCTOR DEVICE AND METHOD OF MANUFACTURING SAME," filed on Mar. 22, 2011, which claims the priority benefit of Japanese Patent Application Number JP2010-078239, filed in the Japanese Patent Office on Mar. 30, 2010. The entire contents of these applications is hereby incorporated by reference in their entireties.

BACKGROUND OF THE INVENTION

1. Field of the Invention

The present invention relates to a photo-emission semiconductor device having such a structure that light emitted toward a side opposite to an exit window side is reflected by a light reflection layer toward the exit window side and a method of manufacturing the same.

2. Description of the Related Art

The external quantum efficiency of a photo-emission semiconductor device such as a light emitting diode (LED) is made up of two elements, namely, internal quantum efficiency and light extraction efficiency. An improvement in these efficiencies makes it possible to realize a long-life, low-power and high-output photo-emission semiconductor device. Here, the internal quantum efficiency in the former is improved by, for example, managing growth conditions precisely so as to obtain a high quality crystal with little crystal defect and dislocation, or providing a layered structure capable of suppressing the occurrence of carrier overflow. On the other hand, the light extraction efficiency in the latter is improved by, for example, providing a geometric shape or a layered structure that provides a large proportion of light, which is emitted from an active layer and enters at an angle less than an escape cone before the light is absorbed by a substrate and the active layer, to an exit window. In addition, an improvement may be also made by providing a light reflection layer made of a material with a high reflectance, so that light emitted toward to a side opposite to the exit window side is reflected toward the exit window side.

Incidentally, in the photo-emission semiconductor device such as the light emitting diode, the light reflection layer mentioned above usually functions as an electrode that injects current into a semiconductor layer and thus is desired to be electrically in good contact with the semiconductor layer. Therefore, generally, aluminum (Al), gold (Au), platinum (Pt), nickel (Ni), palladium (Pd) or the like that is electrically in good contact with various kinds of semiconductor layer and has great versatility is used as a material of forming the light reflection layer. However, even when these materials are applied to the light reflection layer, the reflectance does not become so high and therefore, these materials are often unsuitable for uses necessitating a high reflectance.

Thus, when a high reflectance is needed, silver (Ag) with an extremely high reflectance is applied to the light reflection layer. Silver is electrically in good contact with a semiconductor layer of a long wavelength region based on AlGaAs, AlGaInP or the like, and easily causes ohmic contact. However, silver is electrically in poor contact with a semiconductor layer of a short wavelength region based on GaN or the like, and easily causes ohmic contact close to Schottky contact as compared to other material bases, and therefore, linearity becomes low. Thus, in the past, there was proposed a technique of providing an extremely thin protective layer (so-called cover metal) having a thickness of 0.1 nm to 0.5 nm both inclusive and containing platinum (Pt), palladium (Pd) or nickel (Ni), between a light reflection layer made of silver and a semiconductor layer (for example, see Japanese Unexamined Patent Application Publication No. 2004-260178 and "High thermally stable Ni/Ag(Al) alloy contacts on p-GaN", Applied Physics Letters 90, 022102 (2007), by C. H. Chou, et. al.). Provision of this cover metal prevents deterioration caused by oxidation of the light reflection layer, and also prevents occurrence of electrochemical migration.

SUMMARY OF THE INVENTION

Such a cover metal is usually formed by a lift-off method. Specifically, first, the light reflection layer serving as a base layer is selectively formed on the semiconductor layer and then, a resist layer having an opening at a position corresponding to the light reflection layer and its periphery in a laminated direction is formed by using a photolithography technique. Subsequently, a metal film made of nickel or the like is formed over the entire surface by a vacuum deposition method, for example. Further, the metal film on an area covering the resist layer is removed (lifted off) together with the resist layer, so that the resist layer on an area corresponding to the opening remains. In this way, the cover metal serving as an upper layer that covers the light reflection layer is obtained.

However, the dimension accuracy and the disposition precision of the cover metal by such a lift-off method are largely influenced by many variable factors including the dimension accuracy of the opening in the resist layer, and the accuracy of alignment between the light reflection layer and the opening of the resist layer. For this reason, as a result, the size of the cover metal tends to vary. Therefore, it is conceivable that with the microminiaturization of the photo-emission semiconductor device itself expected in the future, the cover metal may not be able to tightly cover the light reflection layer, so that the prevention of the oxidization of the light reflection layer and the prevention of the electrochemical migration may become insufficient.

In view of the foregoing, it is desirable to provide a photo-emission semiconductor device having such a structure that a light reflection layer is covered by a minute protective layer with high dimension accuracy, and a method of manufacturing the photo-emission semiconductor device.

According to an embodiment of the present invention, there is provided a photo-emission semiconductor device including a semiconductor layer, a light reflection layer provided on the semiconductor layer, and a protective layer formed by electroless plating to cover the light reflection layer.

In the photo-emission semiconductor device according to the above embodiment of the present invention, the protective layer covering the light reflection layer is formed from a plating film formed by electroless plating and thus, the protective layer is disposed at a predetermined position with high accuracy, and has highly precise dimensions as well as a minute organization.

According to an embodiment of the present invention, there is provided a method of manufacturing a photo-emission semiconductor device, the method including the steps of forming a light reflection layer on a semiconductor layer, and forming a plating seed layer on the light reflection layer and then, forming a protective layer by electroless plating using the plating seed layer so as to cover at least the light reflection layer.

In the method of manufacturing the photo-emission semiconductor device according to the embodiment of the present invention, the plating seed layer is formed on the light reflection layer on the semiconductor layer and then, the protective layer is formed so as to cover the light reflection layer by the electroless plating using the plating seed layer. Therefore, the protective layer has highly precise dimensions and alignment accuracy as well as a minute organization.

According to the photo-emission semiconductor device and the method of manufacturing the same in the embodiment of the present invention, it is possible to reliably cover the light reflection layer provided on the semiconductor layer, by the protective layer that has a high mechanical strength and is formed by the electroless plating. Therefore, it is possible to reliably prevent the oxidization and the electrochemical migration of the light reflection layer, while forming the light reflection layer from silver or the like having high reflectance. As a result, it is possible to provide a photo-emission semiconductor device having high reliability, while supporting microminiaturization of dimensions.

Other and further objects, features and advantages of the invention will appear more fully from the following description.

BRIEF DESCRIPTION OF THE DRAWINGS

FIG. 2A and FIG. 2B are cross-sectional diagrams illustrating one process in a method of manufacturing the light emitting diode illustrated in FIG. 1;

FIG. 3A and FIG. 3B;

DETAILED DESCRIPTION OF THE PREFERRED EMBODIMENTS

An embodiment of the present invention will be described below in detail with reference to the drawings.

[Structure of Light Emitting Diode]

Figure 1:
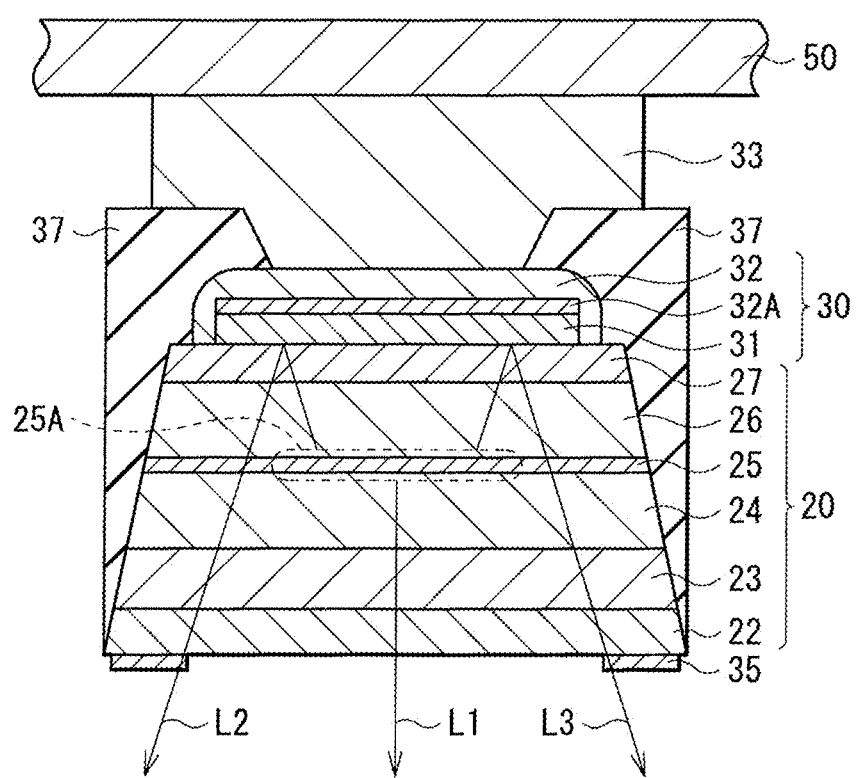
FIG. 1 is a cross-sectional diagram of a light emitting diode serving as an embodiment of the present invention.

FIG. 1 illustrates a cross-sectional structure of a light emitting diode (LED) according to an embodiment of the present invention. Incidentally, FIG. 1 is a schematic diagram in which size and shape are different from those in reality.

The light emitting diode includes a semiconductor layer 20 containing a nitride-based III-V group compound semiconductor, a p-side electrode 30, and an n-side electrode 35. The semiconductor layer 20 is a layered product configured by laying a GaN layer 22, an n-type contact layer 23, an n-type cladding layer 24, an active layer 25, a p-type cladding layer 26 and a p-type contact layer 27 in this order. The p-side electrode 30 is provided on a surface of the p-type contact layer 27, and the n-side electrode 35 is provided on a surface of the GaN layer 2. Part of the p-side electrode 30 is connected to a conductive connection layer 33. The connection layer 33 is bonded to a support substrate 50 with an adhesive layer 39 (not illustrated here) in between. The light emitting diode is a photo-emission semiconductor device of a type (so-called bottom emission type) in which light emitted from the active layer 25 exits through an n-type semiconductor layer configured to include the n-type contact layer 23 and the n-type cladding layer 24.

The nitride-based III-V group compound semiconductor mentioned here is a gallium nitride-based compound that contains gallium (Ga) and nitrogen (N), and there is, for example, GaN, AlGaN (aluminum gallium nitride), AlGaInN (aluminum gallium indium nitride) or the like. These contain n-type impurities formed of IV group and VI group elements such as Si (silicon), Ge (germanium), O (oxygen), Se (selenium) and the like, or p-type impurities formed of II group and IV group elements such as Mg (magnesium), Zn (zinc), C (carbon) and the like, as needed.

The GaN layer 22 is made of, for example, undoped GaN having a thickness of 0.5 µm, and is formed by being allowed to grow on a c-plane of a sapphire with the use of a lateral direction crystal growth technique such as an ELO (Epitaxial Lateral Overgrowth) technique. The n-type contact layer 23 is made of, for example, n-type GaN having a thickness of 4.0 µm, and the n-type cladding layer 24 is made of, for example, n-type AlGaN having a thickness of 1.0 µm.

The active layer 25 has, for example, a multi-quantum well structure in which undoped $In_xGa_{1-x}N$ well layer (0<x<1) having a thickness of 3.5 nm and undoped $In_yGa_{1-y}N$ barrier layer (0<y<1) having a thickness of 7.0 nm are formed as a pair, and the three pairs are layered. The active layer 25 has, in a central area in its in-plane direction, a light emitting region 25A where a photon is generated by recombination of injected electron and hole. The p-type cladding layer 26 is made of, for example, p-type AlGaN having a thickness of 0.5 µm. The p-type contact layer 27 is made of, for example, p-type GaN having a thickness of 0.1 µm, and has a p-type impurity concentration higher than that of the p-type cladding layer 26.

On part of the top surface of the p-type contact layer 27, a light reflection layer 31 is provided. The light reflection layer 31 is covered completely by a protective layer 32 that is a plating film formed by electroless plating. The protective layer 32 is made of, for example, an element selected from a group consisting of nickel (Ni), copper (Cu), palladium (Pd), gold (Au) and tin (Sn) or an alloy including two or more kinds of elements selected from the group.

Between the p-type contact layer 27 and the light reflection layer 31, there may be inserted, for example, a metal layer made of a transition metal such as palladium (Pd), nickel (Ni), platinum (Pt) and rhodium (Rh), or a material in which silver (Ag) is added to any of these transition metals. By providing this metal layer, there are expected effects such as an improvement in mechanical adhesion and an improvement in electrical contact between the p-type contact layer 27 and the light reflection layer 31.

The light reflection layer 31 is made of a material having a metallic property, for example, silver (Ag) or its alloy, and has a thickness of 10 nm or more and 500 nm or less, for example. As the silver alloy, there is an alloy formed by adding at least one of materials including platinum (Pt), palladium (Pd), gold (Au), copper (Cu), indium (In) and gallium (Ga) to silver. To be more specific, the light reflection layer 31 is a so-called APC alloy containing 98% of silver, 1% of palladium, and 1% of copper.

Pure silver and silver alloy each have an extremely high reflectance. For this reason, the light reflection layer 31 performs a function of reflecting, of the light emitted from the light emitting region 25A of the active layer 25, the light heading for the side opposite to the GaN layer 22 serving as an exit window, toward the GaN layer 22. In addition, the light reflection layer 31 forms the p-side electrode 30 together with a metal layer 32A (to be described later) and the protective layer 32, and is electrically connected to the connection layer 33. Therefore, the light reflection layer 31 is also desired to be electrically in good contact with the p-type contact layer 27.

On the top surface of the light reflection layer 31, the metal layer 32A is provided. The metal layer 32A functions as a plating seed layer (a plating seed layer) in forming the protective layer 32 by the electroless plating. A material forming the metal layer 32A is, for example, nickel or nickel alloy.

[Method of Manufacturing Light Emitting Diode]

Next, an example of the method of manufacturing the light emitting diode having such a structure will be described in detail with referenced to FIG. 2A to FIG. 7. Any of FIG. 2A through FIG. 7 illustrates a cross-sectional structure of the light emitting diode in a production process. Here, a case in which plural light emitting diodes are collectively formed will be taken as an example and described.

First, as illustrated in FIG. 2A, for example, a sapphire with an exposed c-plane is prepared as a substrate 10 and then, on the c-plane, a semiconductor film 20A made of a nitride based III-V group compound semiconductor is formed all over the surface, with a buffer layer 11 in between, by MOCVD (Metal Organic Chemical Vapor Deposition) method, for example. The buffer layer 11 also is formed by being allowed to grow at a low temperature on the c-plane of the sapphire by the MOCVD method, and is composed of, for example, undoped GaN having a thickness of 30 nm. In this case, for example, as raw materials of a GaN based compound semiconductor, for example, trimethylaluminum (TMA), trimethylgallium (TMG), trimethyl indium (TMIn) and ammonia ($NH_3$) are used; as a raw material of a donor impurity, for example, silane ($SiH_4$) is used; and as a raw material of an acceptor impurity, for example, bis(methylcyclopentadienyl)magnesium (($CH_3C_5H_4)_2Mg$) or bis(cyclopentadienyl)magnesium (($C_5H_5)_2Mg$) is used.

Specifically, first, the surface (c-plane) of the substrate 10 is cleaned by, for example, thermal cleaning. Subsequently, on the cleaned substrate 10, the buffer layer 11 is allowed to grow at a low temperature of around 500° C. by, for example, the MOCVD method and then, the GaN layer 22 is allowed to grow at a growth temperature of, for example, 1,000° C., by the lateral direction crystal growth technique such as the ELO.

Subsequently, on the GaN layer 22, the n-type contact layer 23, the n-type cladding layer 24, the active layer 25, the p-type cladding layer 26 and the p-type contact layer 27 are sequentially allowed to grow by, for example, the MOCVD method. Here, suppose the growth temperature of the n-type contact layer 23, the n-type cladding layer 24, the p-type cladding layer 26 and the p-type contact layer 27 that are layers not including indium (In) is, for example, around 1,000° C., and the growth temperature of the active layer 25 that is a layer including indium (In) is, for example, 700° C. or more and 800° C. or less. After undergoing such crystal growth, the semiconductor layer 20 is heated at a temperature of 600° C. or more and 700° C. or less for several tens of minutes, and thereby the acceptor impurities in the p-type cladding layer 26 and the p-type contact layer 27 are activated.

Next, on the p-type contact layer 27, a resist pattern 40 in a predetermined shape is formed. Subsequently, as illustrated in FIG. 2B, by using this resist pattern 40 as a mask, an exposed part of the semiconductor film 20A is lowered by digging until the exposed part reaches the n-type contact layer 23, by, for example, RIE (Reactive Ion Etching) method using chlorine-based gas, so that a convex section 28 is formed.

Figure 3A:
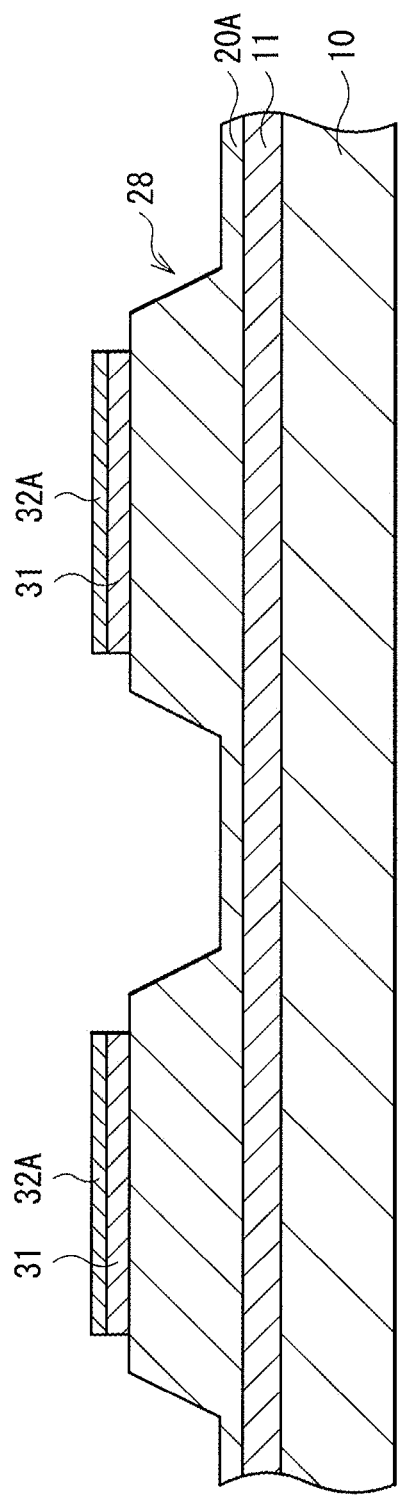
FIG. 3A and FIG. 3B are cross-sectional diagrams illustrating one process following FIG. 2A and FIG. 2B.

Subsequently, as illustrated in FIG. 3A, the resist pattern 40 is removed and then, on the p-type contact layer 27, the light reflection layer 31 and the metal layer 32A are laid sequentially by sputtering, for example.

Figure 3B:
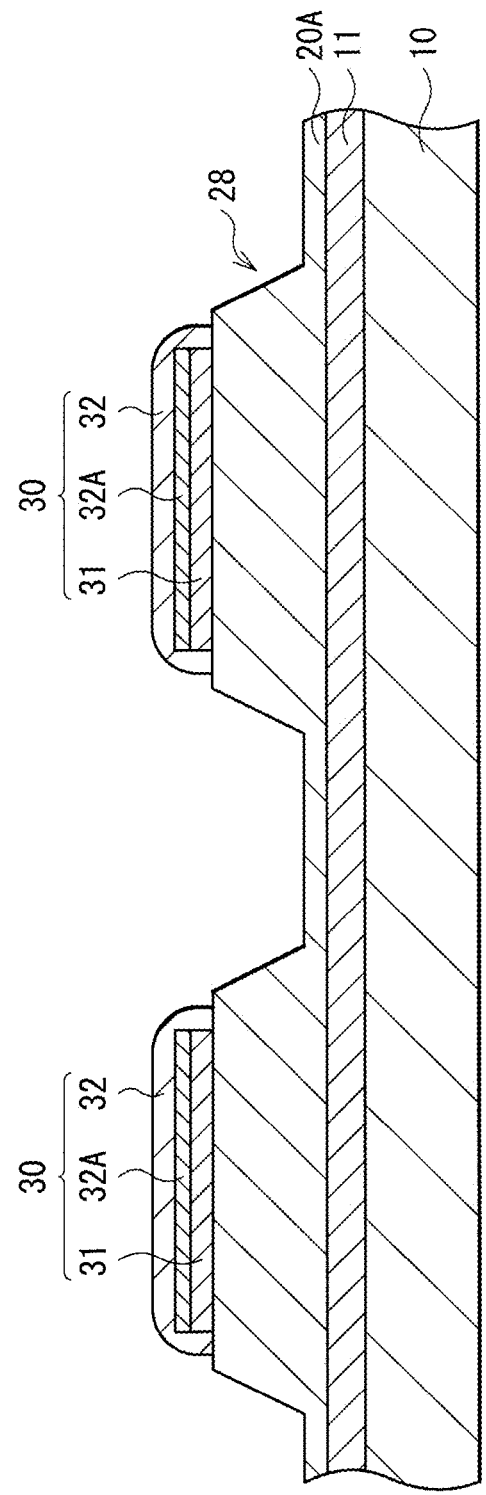
Figure 8:
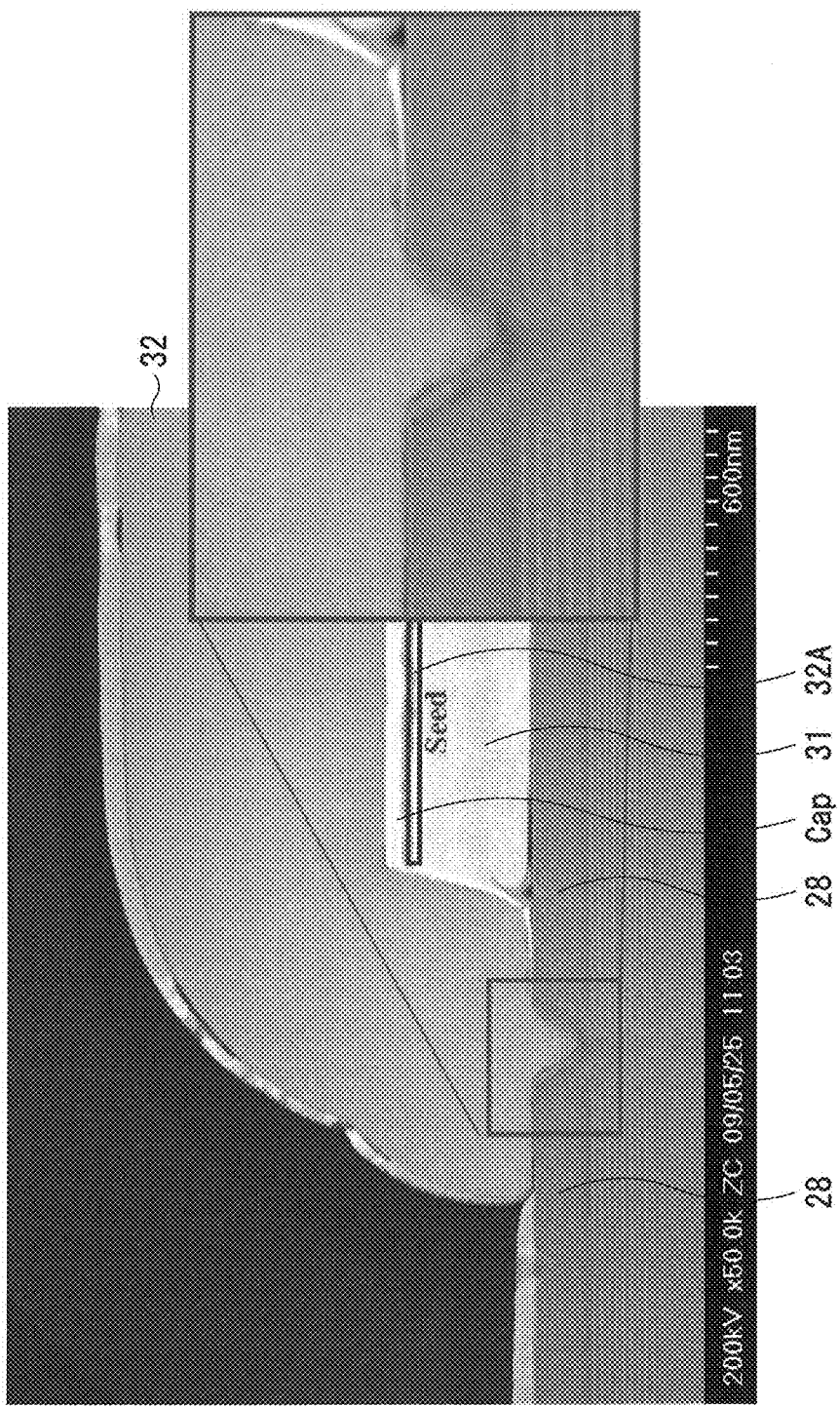
FIG. 8 is an electron micrograph representing a cross-section of the light emitting diode serving as an experimental example.

After the metal layer 32A is formed, as illustrated in FIG. 3B, the protective layer 32 is formed to completely cover the light reflection layer 31, by the electroless plating using the metal layer 32A as a plating seed layer. As a result, the p-side electrode 30 is obtained. At this time, the top surface (the surface on the side opposite to the p-type cladding layer 26) of the p-type contact layer 27, an end surface of the light reflection layer 31 and the surface of the metal layer 32A are at least immersed in a plating bath. This causes plating growth not only on the surface of the metal layer 32A but also on the surface of the p-type contact layer 27 on an area around the metal layer 32A. In other words, here, the plating growth takes place, from one or more regions of the metal layer 32A, the light reflection layer 31 and the p-type contact layer 27. As a result, there is formed the protective layer 32 that is precise and strong and covers the surroundings of the light reflection layer 31 and the metal layer 32A. Here, it is desirable to adjust the surface potentials of the metal layer 32A and the light reflection layer 31, and the electric potential of the p-type cladding layer 26 that fluctuates by those surface potentials, by changing at least one of the thickness of the metal layer 32A and the composition of the material. The reason is because this makes it possible to control the electrochemical reactivity in the plating bath, and adjust the formation area (spread) of the protective layer 32 that is a plating film. In particular, the electric potential of the p-type cladding layer 26 converges to a self-potential in the plating bath, as going away from the metal layer 32A according to the size of the internal resistance of the p-type cladding layer 26 in itself. By controlling the gradient of this electric potential, the formation area (spread) of the protective layer 32 is adjustable. Incidentally, FIG. 3A and FIG. 3B illustrate the example in which the metal layer 32A is provided to cover the entire top surface of the light reflection layer 31, but the metal layer 32A may be formed to cover only part of the top surface of the light reflection layer 31. Changing the surface area of the metal layer 32A in this way also can control the reactivity of the electrochemical reaction and thus, the protective layer 32 having a desired planar shape and a desired cross-section is obtainable. FIG. 8 is an electron micrograph representing an example of the cross-section of the light emitting diode in the process equivalent to FIG. 3B. However, in FIG. 8, a cap layer Cap is formed further on the metal layer 32A serving as the plating seed layer, and only the end surface of the metal layer 32A contacts the protective layer 32. According to FIG. 8, it is recognized that the protective layer 32 is formed to also fill the gap between the adjacent convex sections 28 in the semiconductor film 20A. This is considered to be a piece of evidence of the plating growth occurring by also using the surface of the semiconductor film 20A, which is apart from the metal layer 32A serving as the plating seed layer, as a base point.

Figure 4A:
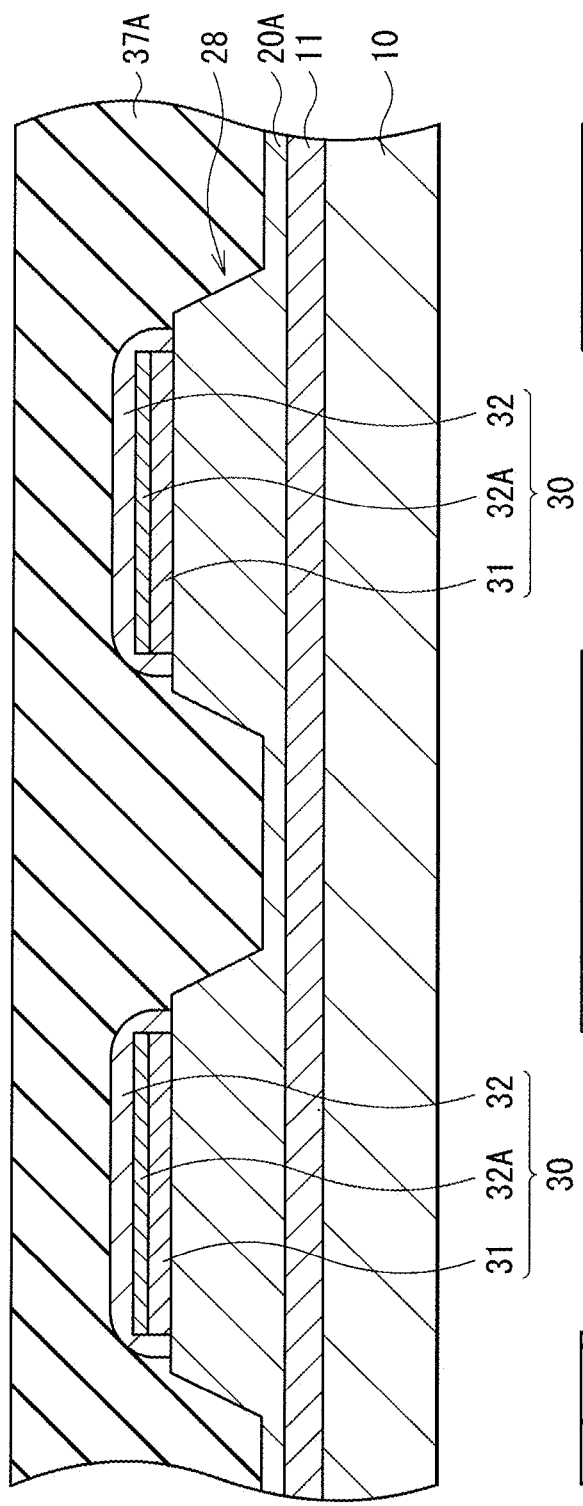
FIG. 4A and FIG. 4B are cross-sectional diagrams illustrating one process following FIG.
Figure 4B:
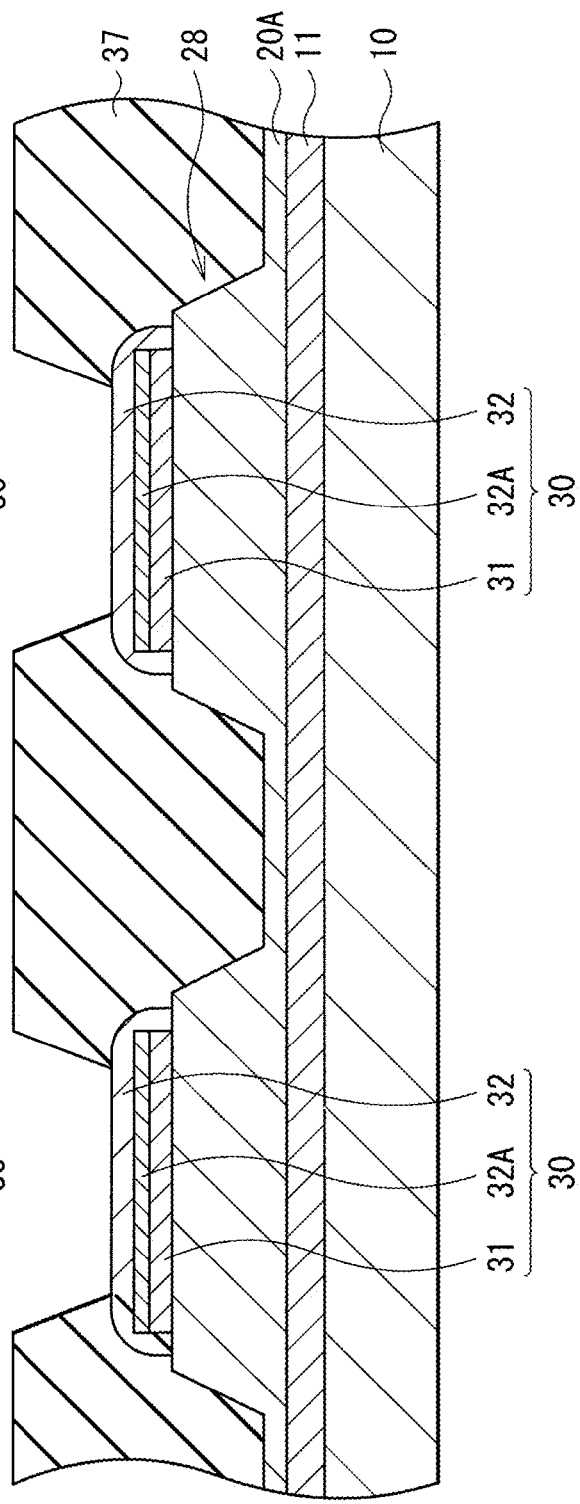

Subsequently, as illustrated in FIG. 4A, a resist is applied to cover the whole so that an insulating film 37A is formed. Afterwards, heat treatment (baking) is performed as needed and then, as illustrated in FIG. 4B, the insulating film 37A is selectively removed by using a photolithography technique so that part of the top surface of the protective layer 32 is exposed, and thereby an insulating layer 37 is formed.

Figure 5:
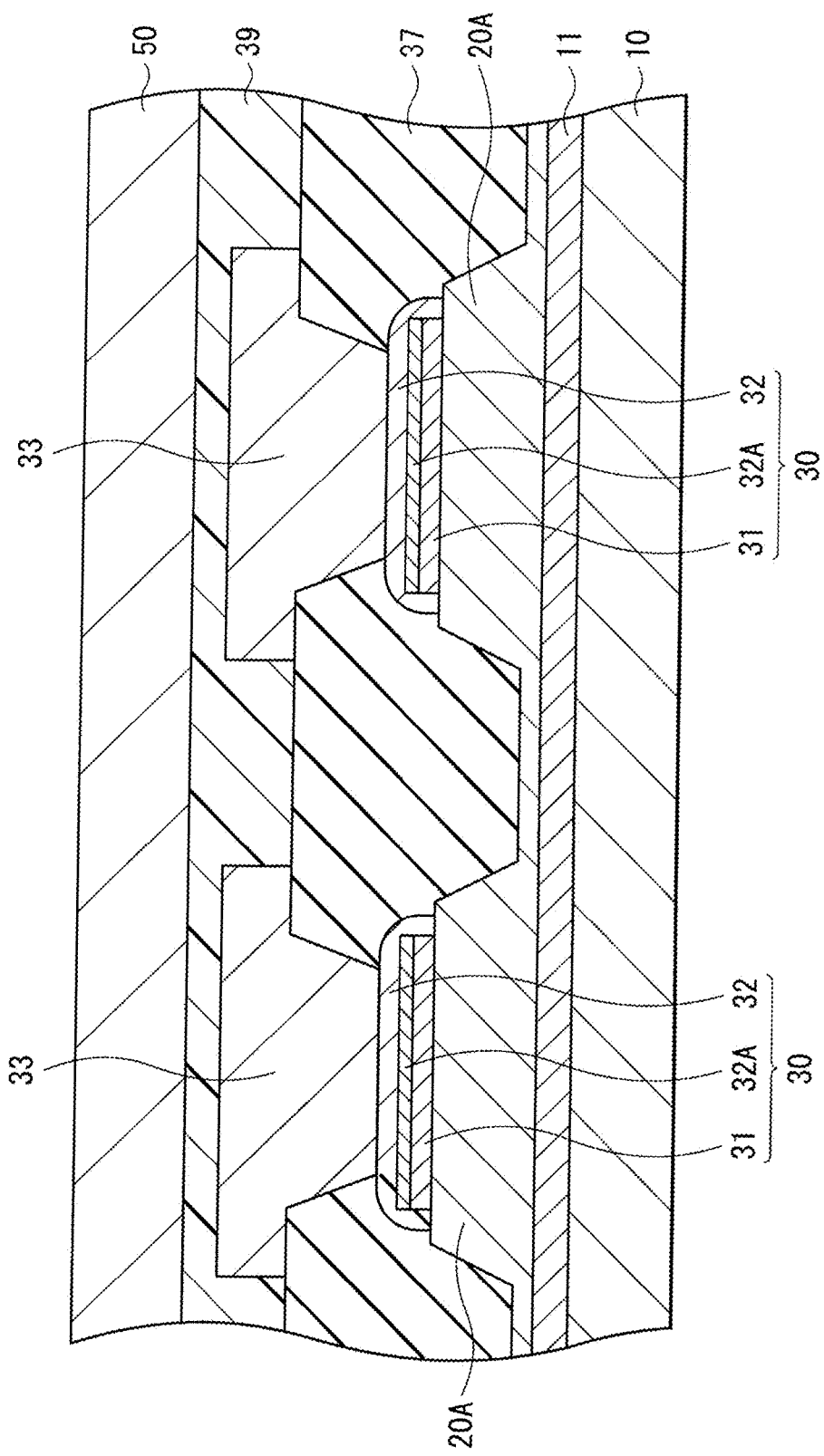
FIG. 5 is a cross-sectional diagram illustrating one process following FIG. 4A and FIG. 4B.

Subsequently, by forming and then patterning a plating film made of copper (Cu) or the like by, for example, an electroplating method, the connection layer 33 connected to the p-side electrode 30 is formed as illustrated in FIG. 5. Afterwards, the adhesive layer 39 is formed to cover the connection layer 33 and fill its periphery, and the support substrate 50 made of sapphire or the like is bonded to the connection layer 33 with the adhesive layer 39 in between.

Figure 6:
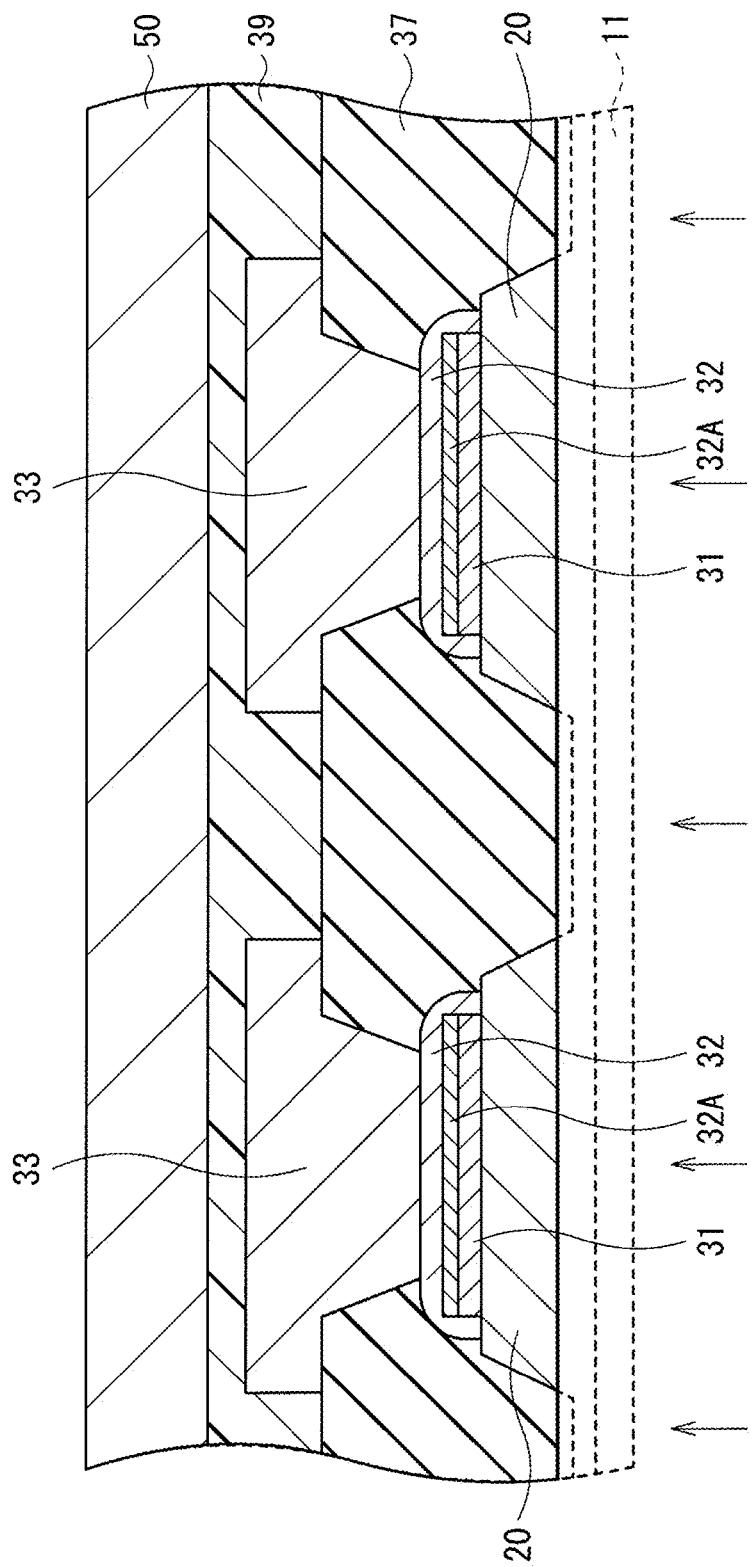
FIG. 6 is a cross-sectional diagram illustrating one process following FIG. 5.

Subsequently, from the back side of the substrate 10, an excimer laser, for example, is emitted over the entire surface. This causes laser ablation, resulting in separation of an interface between the substrate 10 and the buffer layer 11. Afterwards, as illustrated in FIG. 6, chemical mechanical polishing (CMP) is performed in a laminated direction from the buffer layer 11 side, so that the adjacent convex sections 28 are separated from each other and thereby the semiconductor layer 20 is obtained.

Figure 7:
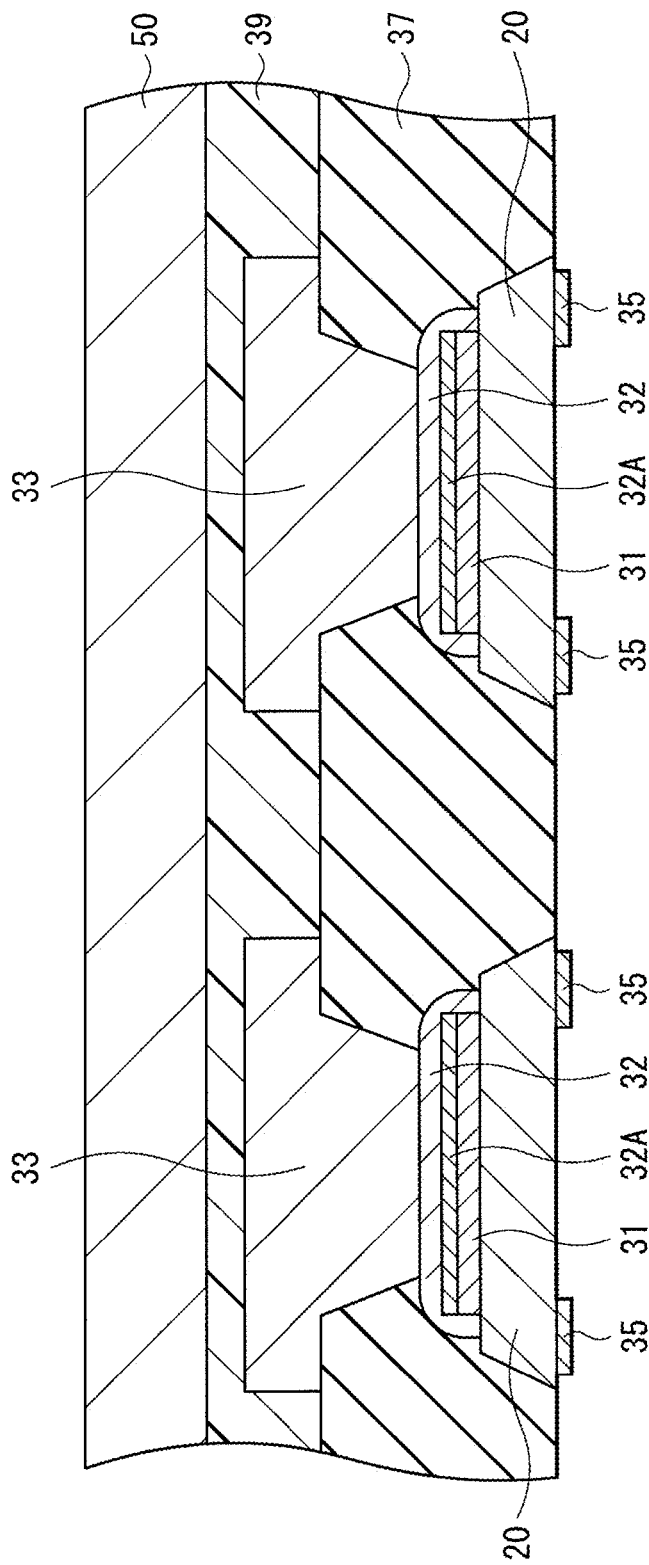
FIG. 7 is a cross-sectional diagram illustrating one process following FIG. 6.

Further, a titanium (Ti) layer, a platinum (Pt) layer and a gold (Au) layer are laid sequentially in this order by vapor deposition or the like, to cover the side opposite to the p-side electrode 30 in the semiconductor layer 20 exposed by CMP processing and then, patterning is performed to form a predetermined shape, so that the n-side electrode 35 is formed (see FIG. 7).

Finally, by going through a predetermined process such as division for each of the semiconductor layers 20, the light emitting diode of the present embodiment is produced.

In the light emitting diode produced in this way, when current is supplied to the p-side electrode 30 and the n-side electrode 35, the current is injected into the light emitting region 25A of the active layer 25, and thereby light emission by the recombination of electron and hole takes place. Light L1, which directly heads for the GaN layer 22 serving as the exit window, among the light of light emission produced in this light emitting region 25A, passes through the substrate 10 and is emitted to the outside. Light L2 and light L3 heading for the side opposite to the GaN layer 22 are reflected by the light reflection layer 31 toward the GaN layer 22 and then, passes through the semiconductor layer 20 and is emitted to the outside (see FIG. 1).

At this time, the light L2 and the light L3 are reflected by the light reflection layer 31 configured to include silver (Ag) having an extremely high reflectance and thus, the reflectance and the light extraction efficiency become greater than those in a case in which the light reflection layer 31 does not include silver (Ag).

Operation and Effect of Present Embodiment

In this way, in the present embodiment, the protective layer 32 covering the light reflection layer 31 is formed from the plating film formed by the electroless plating and thus, the protective layer 32 has highly precise dimensions and a minute organization. Further, in the formation of the metal layer 32A, the metal layer 32A is formed beforehand as the plating seed layer, and the plating growth is caused also on the surface of the p-type contact layer 27 in the area around the metal layer 32A by the electrochemical reaction with the plating bath and thus, the alignment accuracy of the protective layer 32 improves. In particular, when the surface potential of the metal layer 32A is adjusted by changing the composition of the metal layer 32A or changing its surface area, and thereby a force to absorb metal ions in the plating bath (a chemical force that draws metal ions to the metal layer 32A) is adjusted, the protective layer 32 having a higher degree of dimension accuracy and alignment accuracy is obtained. In other words, according to the light emitting diode and the method of manufacturing the same of the present embodiment, the light reflection layer 31 provided on the semiconductor layer 20 is reliably covered without gap, by the protective layer 32 having a great mechanical strength and is formed by the electroless plating. Therefore, it is possible to reliably prevent the oxidization and the electrochemical migration of the light reflection layer 31, while forming the light reflection layer 31 from silver (Ag) or the like having high reflectance. As a result, it is possible to realize high reliability, while supporting the microminiaturization of the dimensions of the entire structure.

The present invention has been described by using the embodiment, but the present invention is not limited to the aspect described above, and may be variously modified. For example, in the embodiment described above, the electroless plating is performed in the state in which the surface of the metal layer 32A is exposed. However, a cap layer may be further provided between the metal layer 32A and the protective layer 32, and the electroless plating may be performed in a state in which only the end surface of the metal layer 32A is exposed. This makes it possible to control the electrochemical reaction in the plating bath by changing only the thickness of the metal layer 32A, without changing the composition of the material or the formation area of the metal layer 32A. Therefore, even in this case, it is possible to obtain the protective layer 32 in which the planar shape and the cross-sectional shape are defined with higher accuracy, and an effect similar to that of the above-described embodiment is achievable. Here, the cap layer may be made of a material that does not cause an oxidation-reduction reaction in the plating bath, including, for example, a metallic material such as gold (Au) or platinum (Pt) and an inorganic material such as $SiO_2$. The cap layer is not limited to a single-layer structure, and may be a multilayer structure of two more layers. Moreover, another metal layer may be provided between the metal layer 32A and the light reflection layer 31.

Furthermore, the embodiment has been described above for the light emitting diode configured to include the nitride-based III-V group compound semiconductor, but the present invention is not limited to this, and is applicable to a light emitting diode of a long wavelength region, made of other semiconductor materials of, for example, AlGaAs base, AlGaInP base and the like.

The present application contains subject matter related to that disclosed in Japanese Priority Patent Application JP 2010-078239 filed in the Japan Patent Office on Mar. 30, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a photo-emission semiconductor device, the method comprising:
    forming a light reflection layer on a semiconductor layer;
    forming a plating seed layer on the light reflection layer;
    forming a cap layer on the plating seed layer so that only an end surface of the plating seed layer is exposed, wherein the cap layer includes $SiO_2$; and
    forming a protective layer by electroless plating using the plating seed layer, wherein the cap layer is formed of a material that does not cause an oxidation-reduction reaction in a plating bath used to form the protective layer by electroless plating.

2. The method of manufacturing the photo-emission semiconductor device according to claim 1, wherein the protective layer is formed on one or more regions of the plating seed layer, the light reflection layer and the semiconductor layer.

3. The method of manufacturing the photo-emission semiconductor device according to claim 1, wherein a planar shape and a cross-sectional shape of the protective layer are based on an exposure area size of the plating seed layer.

4. The method of manufacturing the photo-emission semiconductor device according to claim 1, wherein a planar shape and a cross-sectional shape of the protective layer are based on a material of the plating seed layer.

5. The method of manufacturing the photo-emission semiconductor device according to claim 1, wherein forming the protective layer includes covering sides of the light reflection layer with the protective layer by electroless plating such that the protective layer directly contacts the sides of the light reflection layer.

* * * * *